United States Patent
Kassai

(10) Patent No.: US 8,080,997 B2
(45) Date of Patent: Dec. 20, 2011

(54) MAGNETIC RESONANCE IMAGING (MRI) APPARATUS AND METHOD FOR REDUCED EDDY CURRENT GENERATION IN THE IMAGED OBJECT

(75) Inventor: Yoshimori Kassai, Tochigi-ken (JP)

(73) Assignees: Kabushiki Kaisha Toshiba, Minato-Ku, Tokyo (JP); Toshiba Medical Systems Corporation, Otawara-Shi, Tochigi-Ken (JP)

(*) Notice: Subject to any disclaimer, the term of this patent is extended or adjusted under 35 U.S.C. 154(b) by 295 days.

(21) Appl. No.: 12/555,994

(22) Filed: Sep. 9, 2009

(65) Prior Publication Data
US 2010/0090695 A1   Apr. 15, 2010

(30) Foreign Application Priority Data
Sep. 9, 2008   (JP) ................... 2008-230728

(51) Int. Cl.
*G01V 3/00* (2006.01)
(52) U.S. Cl. ................. 324/307; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 7,365,543 B2* | 4/2008 | Yui et al. | | 324/318 |
| 7,613,496 B2* | 11/2009 | Miyazaki et al. | | 600/419 |
| 7,825,660 B2* | 11/2010 | Yui et al. | | 324/306 |
| 2008/0161678 A1* | 7/2008 | Miyazaki et al. | | 600/419 |
| 2009/0212772 A1* | 8/2009 | Ookawa | | 324/309 |

FOREIGN PATENT DOCUMENTS
JP   2002-85372   3/2002
JP   2004-329613   11/2004

OTHER PUBLICATIONS

Examiner's judgement is based on the two abstracts provided in English.

* cited by examiner

Primary Examiner — Brij Shrivastav
(74) Attorney, Agent, or Firm — Nixon & Vanderhye PC

(57) ABSTRACT

An MRI apparatus and method reduces eddy currents generated by changing gradient magnetic fields used to image an object. Positioning image data from a pilot imaging mode is used to set reference imaging conditions for a subsequent actual diagnostic imaging mode used to acquire diagnostic image data. An eddy current stimulus index is calculated for a gradient magnetic field polarity successively (i.e., iteratively) renewed (i.e., changed) by renewal of imaging conditions and phase-encoding direction. Diagnostic image data is generated during an actual diagnostic imaging mode based on a gradient magnetic field polarity and phase-encoding direction that provides the lowest eddy current stimulus index value, thus using an optimum set of imaging conditions.

20 Claims, 8 Drawing Sheets

MAGNETIC RESONANCE IMAGING (MRI) APPARATUS AND METHOD FOR REDUCED EDDY CURRENT GENERATION IN THE IMAGED OBJECT

CROSS-REFERENCE TO RELATED APPLICATION

This application claims priority under 35 U.S.C. §119(a) from, and the benefit of, Japanese Patent Application No. 2008-230728 filed on Sep. 9, 2008, the contents of which are hereby expressly incorporated herein by reference in their entirety.

BACKGROUND

A. Technical Field

This relates to magnetic resonance imaging (MRI) apparatus and method and, more particularly, to MRI apparatus and method that can effectively select appropriate MR imaging conditions to avoid dangerous eddy currents to an imaged object generated due to changing magnetic field intensities (dB/dt) of a plurality of gradient magnetic fields used to acquire MR signals from the object being imaged.

B. Background

MRI (magnetic resonance imaging) involves magnetically exciting nuclear spins in an object located within a static magnetic field by applying radio frequency (RF) pulses at the nuclei's Larmor frequency. Image data is reconstructed based on acquired magnetic resonance (MR) signals induced by nutation of the nuclear spins.

MRI apparatus can acquire various diagnostic data, such as diagnostic anatomy data, diagnostic biochemistry data and diagnostic functional data for various body units. Thus, MRI apparatus is now used in various image diagnosis fields.

In recent years, high-speed imaging methods for MRI apparatus have been developed to analyze functional units of a brain or heart (e.g., cardiac function units). For instance, by applying a high-speed echo planar imaging (EPI) method, acquisition time for acquiring one MRI can be reduced to less than 100 milliseconds. Consequently, if the image data acquisition time is shortened sufficiently, it becomes possible to acquire various MRI images at desired time phases of a moving organ, such as a beating heart.

Parallel imaging (PI) methods also have been proposed as disclosed in Japanese Patent Application Publication No. 2004-329613. The PI method can acquire phase-encoded MR signals using a plurality of phase-encoding gradient magnetic fields during data read-out by using a multi-coil having a plurality of RF element coils. The PI method can generate image data in a short time having no wraparounds by performing an expansion process on the acquired MR signals based on sensitivity distributions of the RF element coils.

In such high-speed MR imaging methods, three gradient magnetic fields are respectively switched at high speed in order to shorten MR signal acquisition time. The three gradient magnetic fields may include a slice-selecting gradient magnetic field, a frequency-encoding gradient magnetic field and a phase-encoding gradient magnetic field that are all orthogonally disposed with respect to each other.

Usually, in accordance with a time-changing gradient magnetic field, eddy currents are induced in the imaged object (e.g., a living body) due to the time rate of change of magnetic field intensity (dB/dt). Typically, for high-speed MR imaging methods, it is necessary to switch the respective three strong gradient magnetic fields at a high speed (i.e., at a high time rate of change). Consequently, it may occur that induced high-density eddy currents exceed an allowable stimulus level for nerves in a living body.

For a cardiac magnetic resonance imaging (MRI) diagnosis, MR image data acquisitions are typically performed for an operator-selected oblique slice cross-section (planar volume) along a desired direction. Thus, MR image data is acquired along an oblique imaging plane (or double oblique imaging planes) by using three gradient magnetic fields (e.g., a slice-selection gradient field, a phase-encoding gradient field and a frequency-encoding gradient field). When the three gradient magnetic fields are respectively switched at high speed, the time rate of change in magnetic field intensity (dB/dt) for each of the three respective gradient magnetic fields is summed up to an effective total time rate of change dB/dt. Consequently, the summed up rate of change of magnetic field intensity (dB/dt) may easily generate dangerous eddy currents (e.g., that exceed an allowable stimulus level for a living body).

To prevent generation of dangerous eddy currents in a conventional MRI apparatus, the expected rate of change in magnetic field intensity (dB/dt) at a given gradient switching time is preliminarily calculated (e.g., at a preliminary stage when pulse sequence executing software based on a reference imaging condition is being set in conjunction with a pilot imaging mode, and MR signal acquisition conditions are being loaded into a prescribed unit of the MRI apparatus). When the preliminarily calculated maximum value of dB/dt exceeds a prescribed threshold value (e.g., corresponding to an allowable stimulus level), a warning from the MRI apparatus is given to an operator.

However, when the conventional warning notice is issued, it is required for an operator to somehow discover a more appropriate set of MR imaging conditions (i.e., conditions capable of restraining eddy current density below the proscribed stimulus level) by renewing (i.e., changing) reference MR imaging conditions with iterative trial and error operations. Such operations for discovering one or more appropriately adjusted reference MR imaging conditions consume time and reduce efficiency of MR imaging operations.

SUMMARY

The above-mentioned problems and defects are herein addressed by an MRI apparatus and method that can more easily select one or more suitable MR imaging conditions capable of acquiring desired MR image data under a condition that restrains generation of eddy currents at or below an allowable level so as to keep an imaged object in a safe state.

Magnetic resonance imaging (MRI) apparatus (and/or method) according to one exemplary embodiment is configured to generate magnetic resonance (MR) image data based on MR signals generated from an object subjected to a static magnetic field, a plurality of switched gradient magnetic fields and irradiating radio frequency (RF) pulses. An imaging condition renewal unit is configured to renew preliminarily set reference MR imaging conditions for the plurality of switched gradient magnetic fields. An eddy current stimulus index is computed for each switched gradient field using iteratively renewed (i.e., changed) sets of reference MR imaging conditions to discover an appropriate set of MR imaging conditions for the gradient magnetic fields based on the computed stimulus indices. An MR diagnostic imaging operation is then performed based on the discovered more appropriate MR imaging condition(s).

For example, once a particular MRI sequence has been chosen in conjunction with a particular set of reference imaging conditions (e.g., slice volume size, orientation, phase-encoding direction, TE/TR intervals, etc.), the expected time rate of change (dB/dt) for each switched gradient field may be calculated at each successive switch point time during the planned MRI sequence. The composite rate of change (dB/dt) in magnetic gradient fields can be calculated by summing the rates of change for each gradient field at each switch point time. Based on known machine and safety parameters, an eddy current stimulus index can then be calculated for each switch point time and compared to a predetermined maximum permitted threshold alarm value.

However, by automatically and iteratively changing (i.e., renewing) one or more of the preliminarily set reference imaging conditions that should not unduly or adversely affect desired image qualities, but which can affect the composite time rate of change dB/dt (e.g., the polarity of gradient fields being switched, some timing parameters, etc.), the maximum eddy current stimulus index for each of plural sets of reference imaging conditions can be calculated. The set of trial reference imaging conditions that provides the smallest (i.e., minimum) value for its maximum expected eddy current stimulus index can then be chosen for subsequent use in an actual diagnostic MRI data acquisition scanning sequence.

It is to be understood that both the forgoing description and the following more detailed description are exemplary, but are not restrictive of claim scope.

BRIEF DESCRIPTION OF THE DRAWINGS

The accompanying drawings, which are incorporated in and constitute part of this specification, illustrate various embodiments and/or features of embodiments, and together with the description, serve to explain embodiments. Where possible, the same reference numbers will be used throughout the drawings to describe the same or like parts. In the drawings.

DETAILED DESCRIPTION OF EXEMPLARY EMBODIMENTS

In one exemplary MRI apparatus embodiment, reference imaging conditions for an actual diagnostic imaging mode (i.e., for acquiring diagnostic image data) are set using pilot positioning image data in a pilot imaging mode. The reference imaging conditions include position of a slice-section in an actual diagnostic imaging mode, polarity of a slice-selecting gradient magnetic field (i.e., used for acquiring MR signals at the slice-section), and a phase-encoding gradient magnetic field direction. By successively revising the gradient magnetic fields and the phase-encoding direction, the maximum eddy current stimulus index for switching point times of the gradient magnetic fields is calculated. The preliminary reference imaging conditions are then renewed for optimized actual diagnostic imaging by phase-encoding direction and switched gradient magnetic fields which cause the extracted stimulus index to be at its minimum value. Based on such renewed optimum imaging conditions (e.g., derived in conjunction with the pilot imaging mode), diagnostic image data in an actual diagnostic imaging mode are generated.

An appropriate imaging condition for acquiring desired diagnostic image data can in this way be easily set in a short time while restraining generated eddy currents in an object to an allowable and lowest level. Consequently, the exemplary MRI apparatus can improve efficiencies of MRI examination and reduce burdens imposed on an imaged object and/or on an operator.

In the following exemplary embodiment, the parallel imaging (PI) method is used as an exemplary high-speed imaging technique for setting optimum imaging conditions. Of course, methods other than the PI method can be used.

Figure 1:
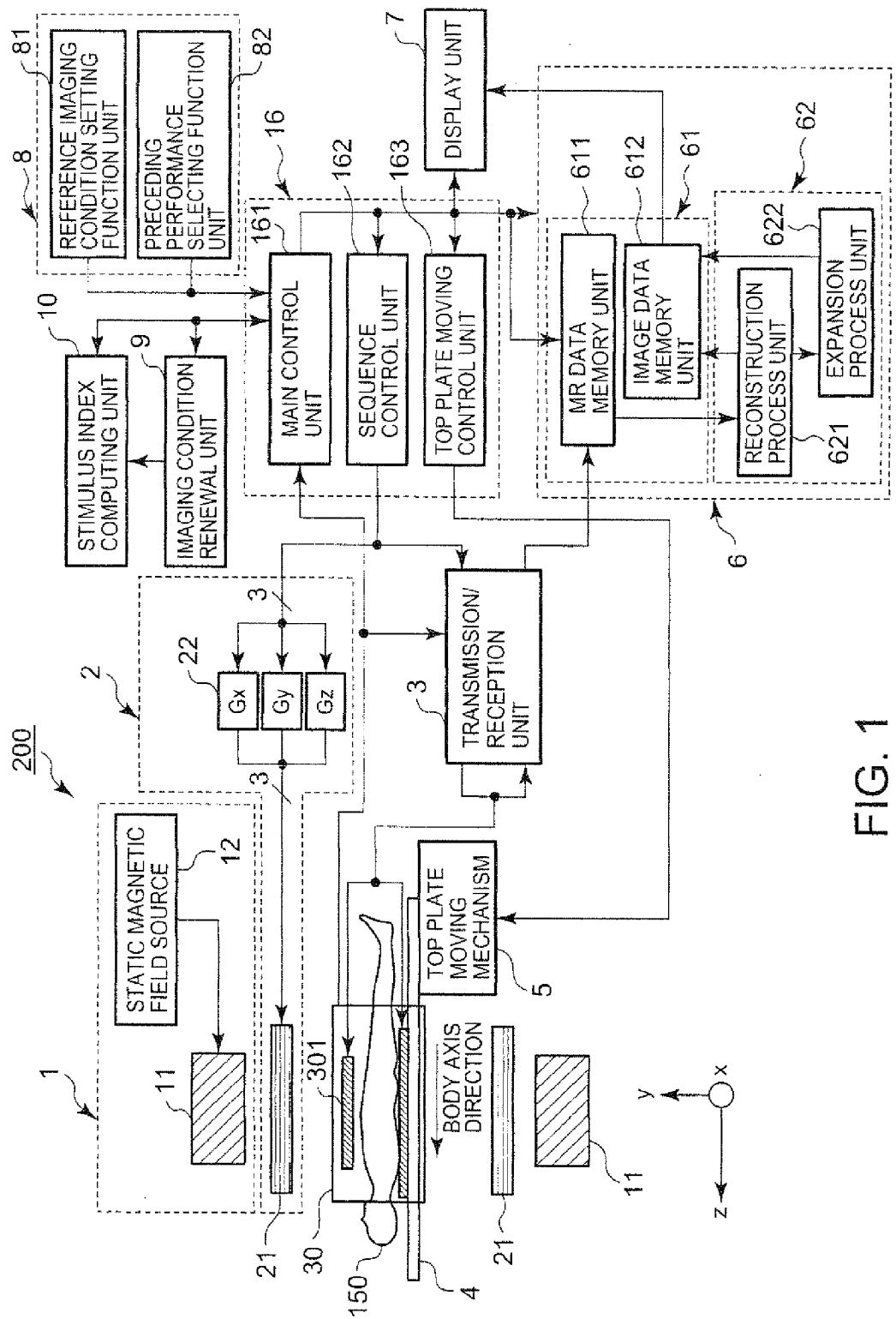
FIG. 1 is a block diagram illustrating a total construction of one exemplary embodiment of MRI apparatus.

FIG. 1 is a block diagram illustrating an exemplary MRI apparatus. MRI apparatus 200 includes a static magnetic field generating unit 1 and a gradient magnetic field generating unit 2 for generating magnetic fields within an object 150 to be imaged, an RF coil unit 30 for irradiating nuclei-nutating RF pulses into the object 150 and for detecting resultant MR RF signals from the object, a transmission/reception unit 3 for supplying RF pulses to the RF coil unit 30 and for performing a prescribed process on detected MR signals received through the RF coil unit 30, a bed top plate 4 for supporting the object 150, and a bed top plate moving mechanism unit 5 for moving the bed top plate 4 along a body axis (hereinafter referred to as "the z-axis") of the object 150.

MRI apparatus 200 further includes an image data generating unit 6, a display unit 7, an input unit 8, an imaging condition renewal unit 9, a stimulus index computing unit 10 and a control unit 16. Image data generating unit 6 generates image data by performing reconstruction processes on MR signals received by the transmission/reception unit 3 in a pilot imaging mode for acquiring positioning image data and in an actual diagnostic imaging mode for acquiring diagnostic image data. Display unit 7 displays image data generated in the image data generating unit 6. It will be understood that the various "units" of apparatus herein described may be realized by corresponding sets of stored computer program code when executed by a CPU—which may be shared by another "unit" sometimes executing its respectively corresponding set of computer program code stored in the same or another storage medium accessible by the CPU.

Input unit 8 performs various settings of, for instance, MR signal acquiring conditions, image data generating conditions and image data displaying conditions, and reference imaging conditions including positions and directions of slice-sections for acquiring image data permits inputting of various command signals.

Imaging condition renewal unit 9 renews the reference imaging conditions initially set in input unit 8 in accordance with a prescribed process. Stimulus index computing unit 10 calculates a stimulus index based on (a) the reference imaging conditions initially set in input unit 8 or (b) the renewed imaging conditions provided by imaging condition renewal unit 9. Control unit 16 controls operations of each unit in MRI apparatus 200.

Static magnetic field generating unit 1 includes a main magnet 11 comprised of a resistive magnet or a superconducting magnet and a static magnetic field source 12 for supplying currents to the main magnet 11 in order to generate strong static magnetic fields in object 150 placed in an imaging field at a center portion of a gantry (not shown). It is also possible to construct the main magnet 11 by using a permanent magnet.

Gradient magnetic field generating unit 2 includes gradient magnetic field coils 21 configured to generate gradient magnetic fields along a body axis direction (i.e., a z-axis direction shown in FIG. 1, an x-axis direction and a y-axis direction that are all orthogonal with respect to each other), and gradient Gx, Gy, Gz magnetic field sources 22 for supplying pulse currents to each of the respectively corresponding gradient magnetic field coils 21.

Gradient magnetic field coils 21 and gradient magnetic field power sources 22 effectively add spatial position-encoded data to the imaging field in which object 150 is placed based on the sequence control signals supplied from control unit 16. Thus, gradient magnetic field power sources 22 form each gradient magnetic field along each of the x-axis direction, y-axis direction and z-axis direction based on the sequence control signals supplied from control unit 16. Each pulse current supplied to its corresponding gradient magnetic field coil 21 along the x-axis direction, y-axis direction or z-axis direction is controlled. These gradient magnetic fields along the x-axis direction, y-axis direction and z-axis direction are composed so as to form mutually orthogonal slice-selection gradient magnetic field Gs, phase-encoding gradient magnetic field Ge and frequency-encoding (reading out) gradient magnetic field Gr. These resultant Gs, Ge and Gr gradient magnetic fields are supplied to object 150 in addition to the static magnetic field formed by main magnet 11. As will be appreciated, all of these magnetic fields are directed parallel to the z-axis—albeit the gradient fields vary in strength as a function of spatial position along mutually orthogonal axes.

Figure 2:
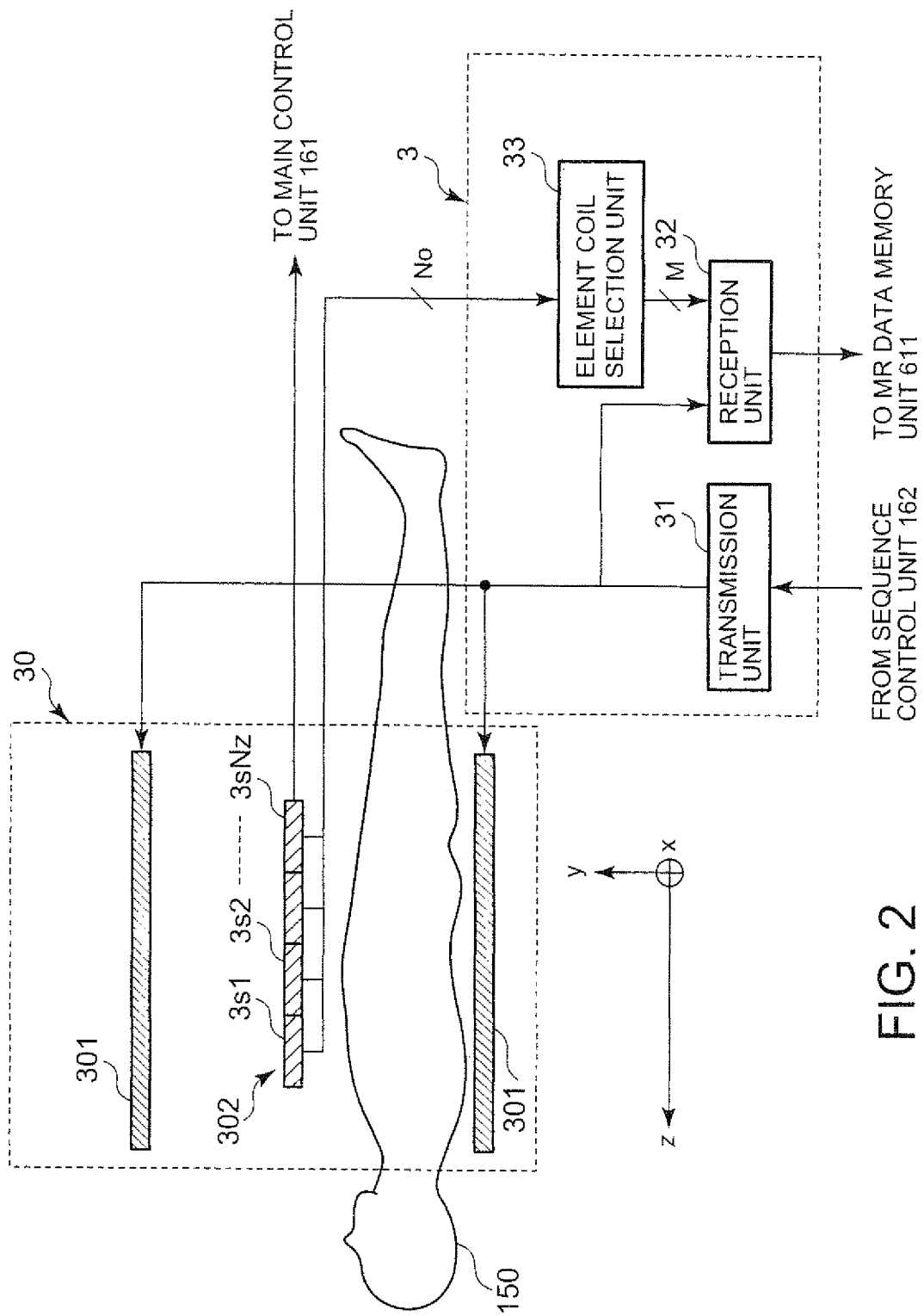
FIG. 2 is a block diagram illustrating constructions of an RF coil unit and a transmission/reception unit provided in the exemplary embodiment of MRI apparatus.

FIG. 2 illustrates practical embodiments of RF coil unit 30 and transmission/reception unit 3 in MRI apparatus 200. RF coil unit 30 is provided in a gantry (not shown) of MRI apparatus 200 in conjunction with gradient magnetic field coils 21. The exemplary RF coil unit 30 includes a whole body transmitting and receiving coil (WB coil) 301, as well as receiving multi-coils 302 provided more closely adjacent to object 150.

In a pilot imaging mode (e.g., for generating positioning image data for setting position and direction of an object slice-section from which diagnostic image data of an object is to be acquired in a subsequent actual diagnostic imaging mode), a pulse current having a prescribed Larmor frequency and RF envelope is supplied to whole body (WB) coil 301 in order to irradiate RF pulses into a to-be-imaged region of object 150 placed in the high-strength static magnetic field. As a result, MR signals are generated by tissues in object 150, detected by WB coil 301 and supplied to transmission/reception unit 3.

Similar to the pilot imaging mode operations, in a subsequent actual diagnostic imaging mode (e.g., by the parallel imaging (PI) method), RF pulse currents having a prescribed frequency and envelope are supplied to WB coil 301 and irradiated into the object 150 imaging region. Resulting MR signals are detected through multi-coils 302, for instance, through each of 2D arrayed element coils, and supplied to transmission/reception unit 3. At this time, multi-coils 302 form a plurality Nz of sections $3s1$ to $3sNz$ along a body axis direction (the z-axis direction). Further, each of the plurality of coil sections has a plurality Nx of element coils (channels) along the x-axis direction.

Figure 3:
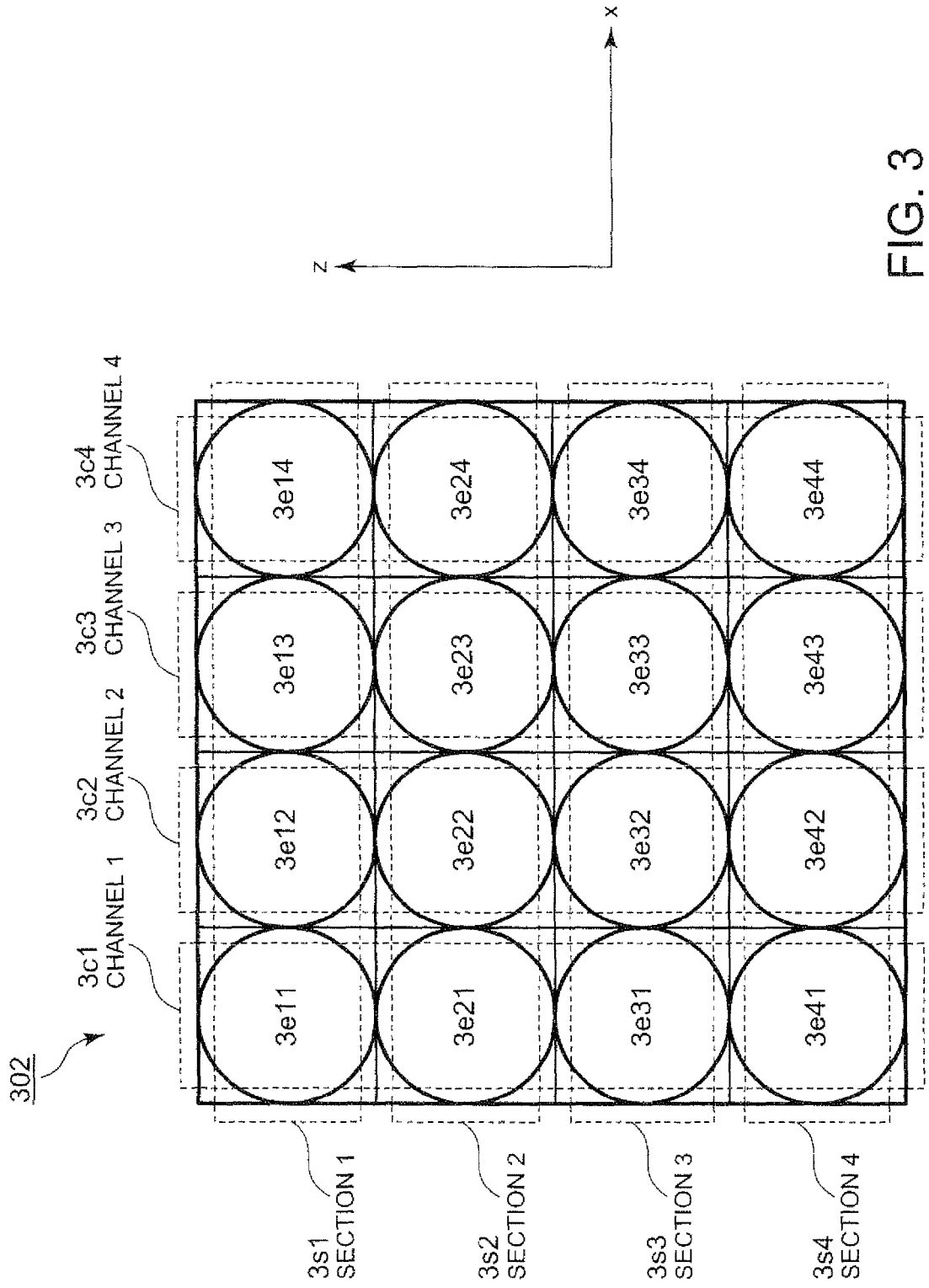
FIG. 3 illustrates multi-coils used for the exemplary embodiment of MRI apparatus.

FIG. 3 illustrates an exemplary embodiment of multi-coils 302. As depicted in FIG. 3, multi-coils 302 are divided into four sections: section 1 ($3s1$) to section 4 ($3s4$) along the z-axis direction. Further, each of the sections I (i=1 to 4) includes four element coils (channels) $3ei1$ to $3ei4$ along the x-axis direction. Thus, multi-coils 302 include sixteen coil elements $3e11$, $3e12$, $3e13$, $3e14$, $3e21$, - - - $3e44$, where Nx=Nz=4 coils arranged along the x-axis direction and the z-axis direction, respectively.

The transmission/reception unit 3 in FIG. 2 includes a transmission unit 31, a reception unit 32 and an element coil selection unit 33. Transmission unit 31 supplies RF pulse currents to WB coil 301 during a pilot imaging mode for acquiring positioning image data and an actual diagnostic imaging mode for acquiring diagnostic image data. Thus, transmission/reception unit 3 generates RF pulse currents that have substantially the same resonant Larmor frequency determined by the static magnetic field intensity of main magnet 11 and are modulated by a prescribed selectively excited envelope wave in order to supply RF pulse currents to WB coil 301.

Reception unit 32 includes a pilot imaging reception unit of one channel and an actual diagnostic imaging reception unit of M channels (both not shown). The pilot imaging reception unit receives a one-channel MR signal detected by WB coil 301 in the pilot imaging mode and performs signal processing, such as intermediate frequency conversion, phase detection, low-frequency amplification, filtering and analog/digital (A/D) conversion.

The actual diagnostic imaging reception unit receives MR signals of M (M<No) channels selected by element coil selection unit 33 among the MR signals of No (No=Nx·Nz) detected through the element coils of multi-coils 302 in an actual diagnostic imaging mode. These MR signals are also processed similarly.

Element coil selection unit 33 includes an amplification circuit and a switching circuit (both not shown). Element coil selection unit 33 selects M channels of MR signals corresponding to the channel number of reception unit 32 among MR signals of No (No=Nx·Nz) channels detected by element coils $3eij$ (I=1 to Nz, j=1 to Nx) of multi-coils 302.

To simplify circuit construction, the actual diagnostic imaging reception unit is constructed having a number M of channels that is less than the total available channel number No of element coils. Element coil selection unit 33 selects MR signals of M channels that are needed during an actual diagnostic imaging mode from among MR signals of No channels outputted from multi-coils 302. The selected M channel MR signals are supplied to the actual diagnostic imaging reception unit.

Usually, element coil selection unit 33 is located near multi-coils 302 in order to amplify MR signals of No channels that are detected by element coils 3eij (I=1 to Nz, j=1 to Nx) in multi-coils 302 with a signal-to-noise ratio (S/N) as high as possible.

The bed top plate 4 shown in FIG. 1 is provided on a bed (not shown) so as to slide a body to be imaged along a body axis direction (z-axis direction) placed on the surface. By moving object 150 placed on bed top plate 4 along the z-axis direction, a desired imaging region of the object 150 is set at a desired position in the imaging field. The top plate moving mechanism unit 5 is, for instance, provided at an edge portion of the bed or an under surface of the bed in order to generate driving signals for moving the bed top plate 4 based on top plate moving control signals supplied from control unit 16. By such driving signals, top plate 4 is moved along the z-axis direction at a prescribed speed.

Image data generating unit 6 includes a data memory unit 61 and a high-speed calculation unit 62. Data memory unit 61 includes an MR data memory unit 611 for storing MR data that includes a plurality of MR signals sequentially acquired by successively changing encoding phase and an image data memory unit 612 for storing image data generated by performing a reconstruction process on the MR data.

MR data memory unit 611 stores positioning MR data that includes a plurality of MR signals sequentially acquired in a pilot imaging mode and diagnostic MR data that is sequentially acquired in an actual diagnostic imaging mode.

Image data memory unit 612 stores a positioning image that is acquired by performing a reconstruction process on MR data and a diagnostic image data that is generated by performing a reconstruction process and an expansion process on the diagnostic MR data. In an actual diagnostic imaging mode, a number M of the diagnostic MR data that is acquired by picking up some phase-encoding steps (to shorten MR signal acquisition time) is stored in the MR data memory unit 611.

High-speed calculation unit 62 in image data generating unit 6 includes a reconstruction process unit 621 and an expansion process unit 62. Reconstruction process unit 621 reads positioning MR data stored in MR signal memory unit 611 and generates positioning image data by performing a reconstruction process using a two-dimensional Fourier transform (2DFT). Reconstruction process unit 621 reads a plurality M of diagnostic MR data stored in MR signal memory unit 611 and generates a plurality M of diagnostic image data by performing similar 2DFT image reconstruction processes. At this time, each of the generated diagnostic image data includes wraparounds due to picking up operations in the above-mentioned phase-encoding step.

Expansion process unit 622 includes a sensitivity map data memory unit (not shown) for storing sensitivity map data for element coils of multi-coils 302. Expansion process unit 622 corrects the wraparounds (e.g., removes 2D phase ambiguities) occurring in the diagnostic image data by performing the expansion process for the plurality M of diagnostic image data generated by reconstruction process unit 621 based on stored sensitivity map data. As to the expansion process, details are not mentioned here, since the technology has been publicly disclosed (e.g., see Japanese Patent Application Publication Nos. 2002-315731 or 2004-329613).

The display unit 7 includes a display data generating circuit, a conversion circuit and a monitor (each, not shown). The display unit 7 displays positioning image data and diagnostic image data that are generated in image data generating unit 6. To display positioning image data in the pilot imaging mode, the displaying data generating circuit in display unit 7 generates display data by superposing reference imaging condition data supplied by input unit 8 through control unit 16 on the positioning image data supplied from image data memory unit 612 in image data generating unit 6. The reference imaging condition data includes, for instance, position and direction (i.e., orientation) of an imaged slice-section, phase-encoding direction and polarity of gradient magnetic fields.

The conversion circuit in display unit 7 converts displaying data generated by the image data generating circuit into a prescribed display format in accordance with the preliminarily set image data display conditions, and displays same on a monitor, such as a cathode ray tube (CRT) or a liquid crystal display (LCD) panel, after performing a digital-to-analog (D/A) conversion.

By performing similar steps, a direction/orientation of slice-section and polarity of gradient magnetic fields under the reference imaging conditions and under optimized imaging conditions are displayed on the monitor for comparison. The optimized imaging conditions are explained in more detail later.

If diagnostic image data in an actual diagnostic imaging mode is displayed, the display data generating circuit in display unit 7 generates display data by adding affixed data supplied from control unit 16, such as object data, to the wraparound-corrected diagnostic image data supplied from image data memory unit 612 in image data generating unit 6. The conversion circuit in display unit 7 displays generated display data on the monitor by performing similar conversions as mentioned above.

Input unit 8 is coupled to display unit 7 through the control unit. Input unit 8 includes a display panel and various input devices, such as switches, a keyboard and a mouse, on an operator's table. Input unit 8 includes reference imaging condition setting function unit 81 for setting reference imaging conditions and preceding performance selecting function unit 82 for selecting performance priority of the image data. By using the display panel and the input devices, an input of the object data, setting of MR signal acquiring conditions including a particular MRI pulse sequence, setting the image data generating conditions and the image data displaying conditions, selection of a pilot imaging mode and an actual diagnostic imaging mode and inputting of various command signals are performed.

Reference imaging condition setting function unit 81 in input unit 8 sets reference imaging conditions, such as a slice-section on positioning image data displayed on display unit 7, initial settings of switching between each polarity for a slice-selection gradient magnetic field Gs, a phase-encoding gradient magnetic field Ge and a frequency-encoding gradient magnetic field Gr used for acquiring MR data at the slice-section and initial settings of a phase-encoding direction and a frequency-encoding direction at the slice-section.

The preceding performance selecting function unit 82 in input unit 8 further selects performance priority of image data generated under an optimized imaging condition acquired by renewals of the reference imaging conditions. Practically, the preceding performance selecting function unit 82 selects either a resolution preceding mode for preceding a spatial resolution or an echo time (TE) to repeat time (TR) ratio (TE/TR) preceding mode for a preceding contrast resolution and time resolution (in real time) by shortening the TE/TR ratio.

Imaging condition renewal unit 9 successively changes polarities of slice-selection gradient magnetic field Gs, phase-encoding gradient magnetic field Ge and frequency-encoding gradient magnetic field Gr that are initially set by reference imaging condition setting function unit 81 in input unit 8 in order to iteratively search for a set of imaging conditions where a time rate of change for maximum magnetic field intensity becomes minimized. It is also possible to renew at least the polarity of one of the slice-selection gradient magnetic field Gs or the frequency-encoding gradient magnetic field Gr in the reference imaging condition.

Similarly, imaging condition renewal unit 9 successively renews the phase-encoding direction and the frequency-encoding direction that are initially set for the slice-section by reference imaging condition setting function unit 81 at a prescribed angular distance Δϕ. It is also possible to renew at least the polarity of one of the slice-selection gradient magnetic field Gs or the gradient magnetic field Ge in the reference imaging condition.

Figure 4B:
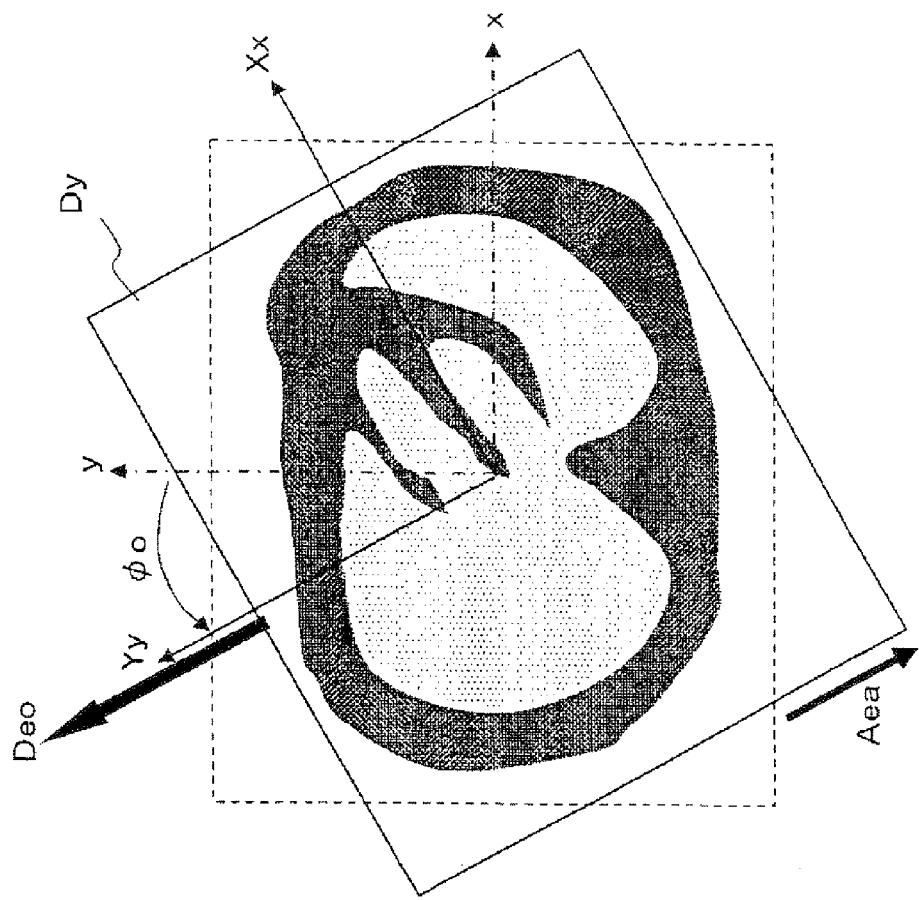
FIG. 4B illustrates initially set reference imaging conditions in an actual diagnostic imaging mode.
Figure 4A:
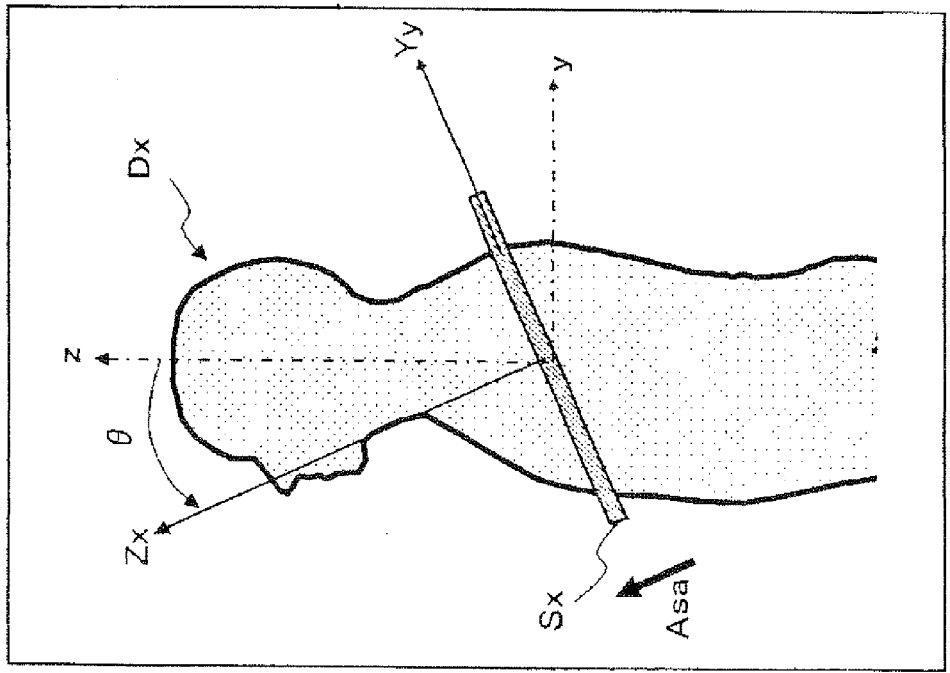
FIG. 4A illustrates initially set reference imaging conditions generated in a pilot imaging mode.
Figure 5B:
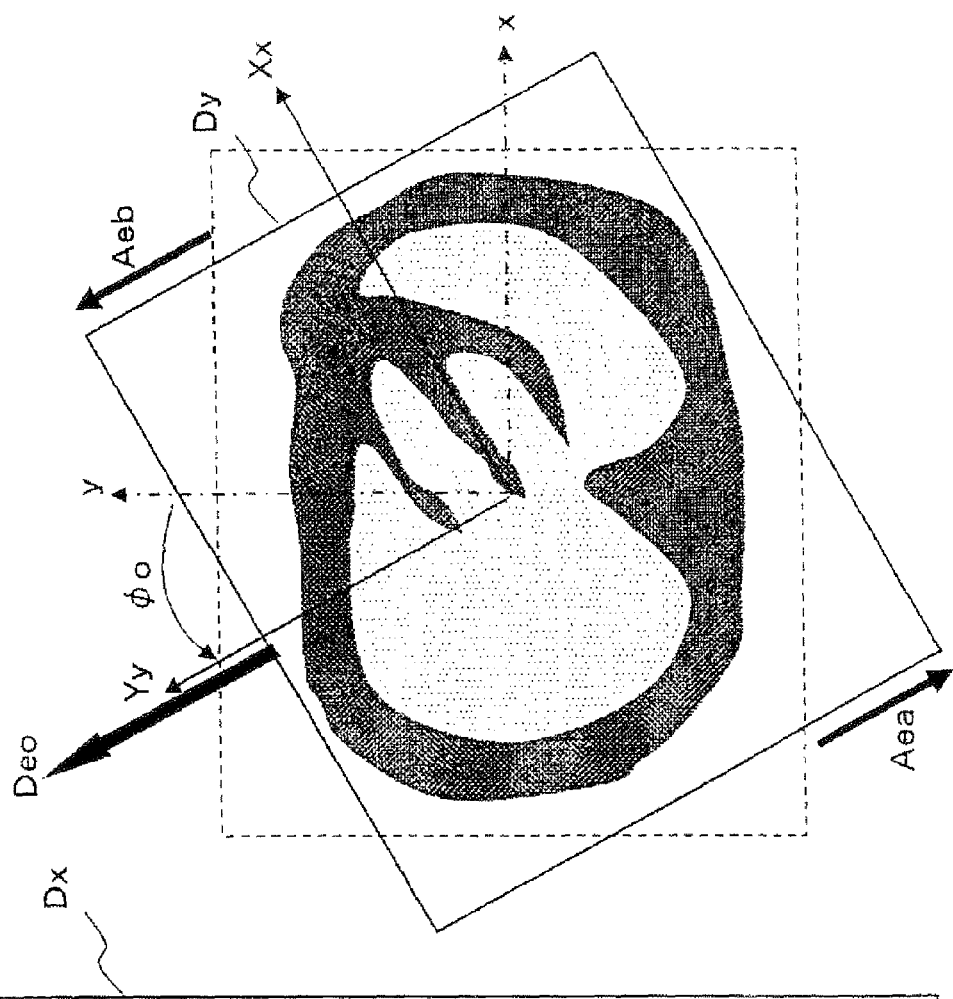
FIG. 5B illustrates polarities of phase-encoding gradient magnetic fields before and after polarity renewal through the imaging condition renewal unit in the exemplary embodiment of MRI apparatus.
Figure 5A:
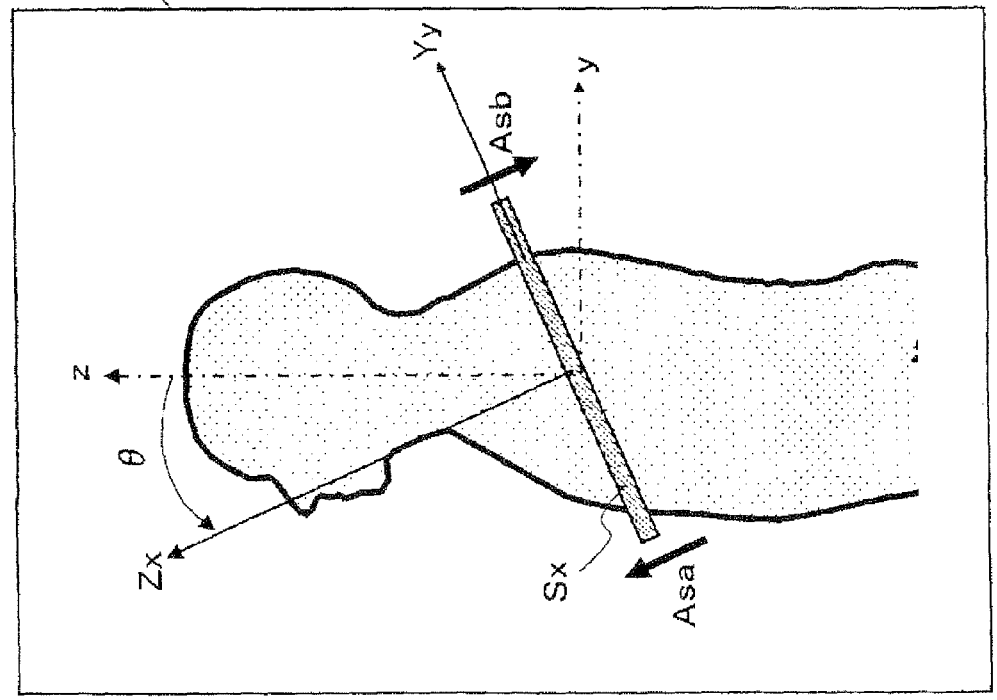
FIG. 5A illustrates polarities of slice-selection gradient magnetic fields before and after polarity renewal through an imaging condition renewal unit in the exemplary embodiment of MRI apparatus.
Figure 6:
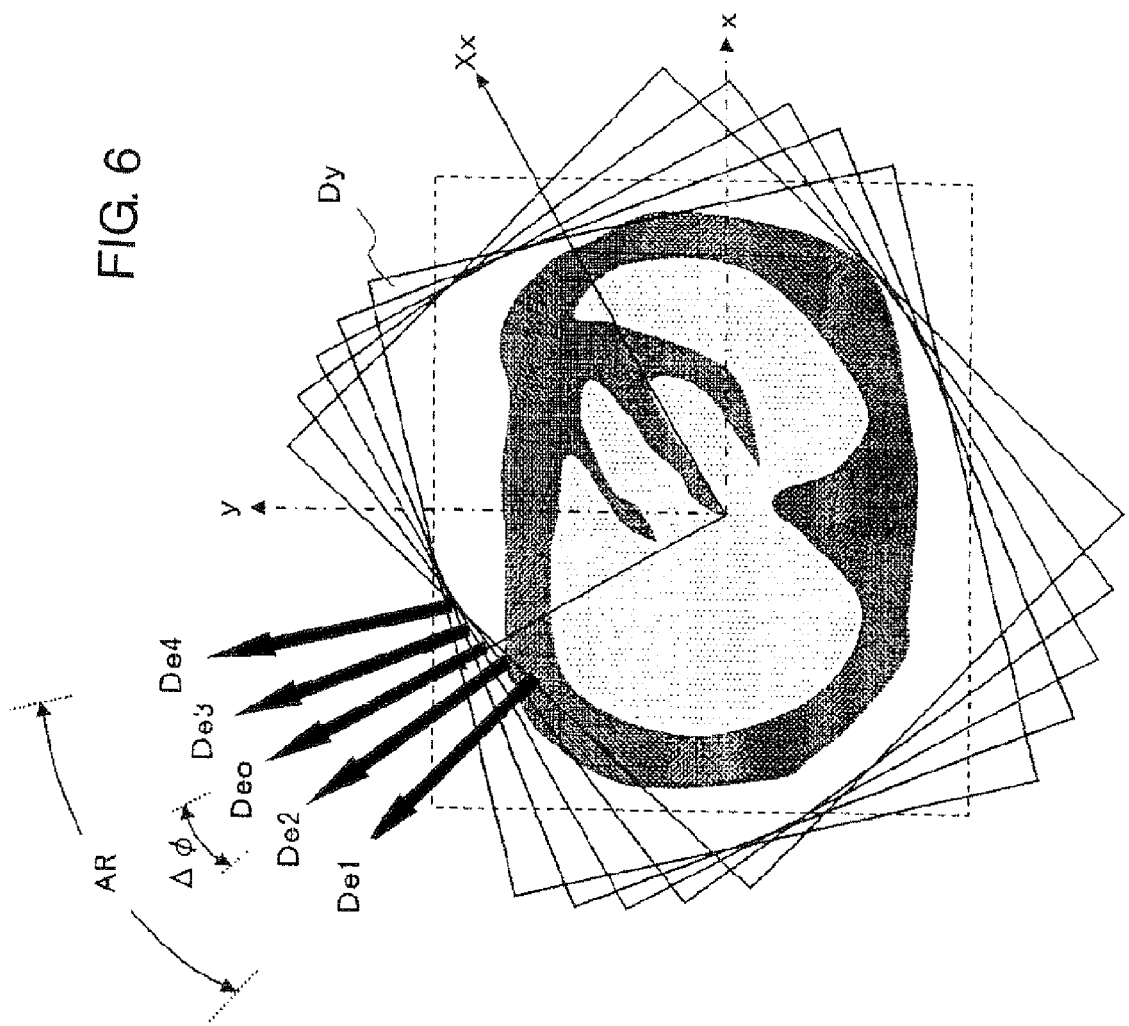
FIG. 6 illustrates a plurality of phase-encoding direction data and a plurality of regions of interest (ROI) corresponding to the plurality of phase-encoding direction data that are displayed on a display unit after being renewed by the imaging condition renewal unit in the exemplary embodiment of MRI apparatus.

With reference to FIGS. 4 to 6, renewals of the imaging conditions performed in imaging condition renewal unit 9 are further explained. FIG. 4A illustrates initially set reference imaging conditions that are generated in a pilot imaging mode. FIG. 4B illustrates reference imaging conditions that are initially set for an actual diagnostic imaging mode.

As illustrated in FIG. 4A, on a monitor in display unit 7 for setting reference imaging conditions, for instance, positioning image data Dx of object 150 acquired at a sagittal cross-section and a cross-section setting marker Sx that are generated in a pilot imaging mode are displayed. By using an input device in input unit 8, the cross-section setting marker Sx that is displayed superposed on the positioning image data Dx is moved as desired in position or direction in order to set reference imaging conditions for reference imaging conditions and actual diagnostic imaging mode. Thus, by moving a perpendicular axis Zx of the cross-section setting marker Sx from a body axis z by an angle θ, position and direction of a slice cross-section, phase-encoding direction and frequency-encoding direction for an actual diagnostic imaging mode are set.

Each polarity of slice-selection gradient magnetic field Gs, phase-encoding gradient magnetic field Ge and frequency-encoding gradient magnetic field Gr is preliminarily set for reference imaging conditions based on an MRI pulse sequence included in the initially set MR signal acquiring conditions. To better understand, the set polarity Asa of the slice-selection gradient magnetic field Gs at this time is shown in FIG. 4A by superposition on positioning image data Dx. Frequency-encoding direction and polarity of frequency-encoding gradient magnetic field Gr are usually decided by the polarity of the phase-encoding direction and the phase-encoding gradient magnetic field Ge.

FIG. 4B illustrates oblique image data Dy at cross-section set y, cross-section setting marker Sx, phase-encoding direction Deo and polarity Aea of phase-encoding gradient magnetic field Ge of the reference imaging conditions that are initially set for acquiring oblique image data Dy.

FIGS. 5 and 6 explain imaging conditions that have been "renewed" by imaging condition renewal unit 9. FIG. 5A illustrates polarity Asa of slice-selection gradient magnetic field Gs before renewal, and polarity Asb of slice-selection gradient magnetic field Gs after renewal of its polarity by imaging condition renewal unit 9. FIG. 5B illustrates polarity Aea of phase-encoding gradient magnetic field Ge before renewal and polarity Aeb of phase-encoding gradient magnetic field Ge after renewal of its polarity. Thus, imaging condition renewal unit 9 renews at least one of (a) polarity Asa of slice-selection gradient magnetic field Gs or (b) polarity Aea of phase-encoding gradient magnetic field Ge.

FIG. 6 illustrates a phase-encoding direction data Deo before renewal and a plurality of phase-encoding direction data De1 to Den that are renewed by the imaging condition renewal unit 9 and a plurality of rectangular regions of interest (ROI) Dy corresponding to each of the direction data sets De0 to Den. Thus, pluralities of ROI Dy are displayed on a common target area in an object. These direction data De0 to Den and the plurality of ROI are displayed on a monitor in display unit 7. At this time, the phase-encoding direction is successively renewed, for instance, by a prescribed angular distance Δϕ within a certain range (AR) centered about the phase-encoding direction Deo of the initial reference imaging conditions.

In this case, the possible renewal scope AR of the phase-encoding direction is dependent on possibility of imaging. Thus, it is decided by the arranging direction of the element coils provided on multi-coils 302 in the RF coil unit 30. In FIG. 6, while the case of n=4 is explained for a better understanding, the teaching here is not limited to such a case.

In FIG. 1, stimulus index computing unit 10 includes a program memory unit, a calculation unit and a comparison unit. The program memory unit in stimulus index computing unit 10 stores a calculation program for calculating a time rate of change in magnetic field intensities and the stimulus index. The calculation unit in stimulus index computing unit 10 calculates a time rate of change for magnetic field intensities of each of slice-selection gradient magnetic field Gs, phase-encoding gradient magnetic field Ge and frequency-encoding gradient magnetic field Gr when such are switched based on the MR signal acquiring conditions and the reference imaging conditions that include an initially set MRI pulse sequence by using the program calculation program stored in the memory unit. When the switching of different gradient magnetic fields is simultaneously performed, the total effective time rate of change of magnetic field intensity is determined by summing up each of the time rate of change data for the respective gradient magnetic fields.

The calculation unit in stimulus index computing unit 10 calculates a stimulus index at a time when each gradient magnetic field is changed by inputting the calculated time rate of change of each magnetic field intensity or the composite time rate of change of magnetic field intensity and the switching time used for calculating the time rate of change of magnetic field intensity into the calculation program stored in the program memory unit.

Instead of calculating the stimulus index by inputting the time rate of change of magnetic field intensity and the gradient magnetic field switching time into a prescribed formula, it is also possible to read out a stimulus index corresponding to the time rate of change of magnetic field intensity and the gradient magnetic field switching time from among a plurality of stimulus indices that are preliminarily stored in the memory by using the time rate of change magnetic field intensity and the gradient magnetic field switching time as parameters.

The comparison unit in stimulus index computing unit 10 extracts the maximum stimulus index by comparing each of stimulus indices calculated at each of switching time phases of a plurality of pulse sequences for the gradient magnetic fields.

Stimulus index computing unit 10 searches a combination of a polarity of the slice-selection gradient magnetic field Gs and a polarity of the phase-encoding gradient magnetic field Ge whereby the maximum stimulus index is minimized by repeated calculations of the time rate of change of magnetic field intensities and the stimulus indices and also by repeated extraction of the maximum stimulus index, based on polarity data of each of the slice-selection gradient magnetic field Gs and the phase-encoding gradient magnetic field Ge successively renewed in the imaging condition renewal unit 9.

Stimulus index computing unit 10 further searches the phase-encoding direction at which the maximum stimulus index becomes minimized by repeated calculation of the stimulus indices and the extraction of the maximum stimulus index based on the phase-encoding direction data successively renewed in imaging condition renewal unit 9 at a preliminarily set polarity of the gradient magnetic field so that the maximum stimulus index becomes minimized.

Thus, the reference imaging conditions preliminarily set in input unit 8 are renewed by the optimized imaging conditions of polarity of the slice-selection gradient magnetic field Gs and polarity of the phase-encoding gradient magnetic field Ge and the phase-encoding direction where the searched maximum stimulus index becomes minimized. Based on the optimized imaging conditions, subsequent acquisition of diagnostic MR data in an actual diagnostic imaging mode is performed. The renewed optimized imaging conditions may be displayed on a monitor in display unit 7 together with the reference imaging conditions.

It is also possible for an operator to select the optimized imaging conditions by displaying a plurality of phase-encoding gradient magnetic fields searched by stimulus index computing unit 10 on the monitor in display unit 7. Thus, as illustrated in FIG. 6, an operator can select a desired phase-encoding direction data or a desired rectangular region of interest (ROI) among a plurality of desired phase-encoding direction data and a plurality of ROI that are displayed on a monitor in display unit 7.

Control unit 16 includes a main control unit 161, a sequence control unit 162 and a top plate moving control unit 163. Main control unit 161 includes a central processing unit (CPU) and a memory circuit for totally controlling operations of MRI apparatus 200. The memory circuit in main control unit 161 stores various data, such as object data that is inputted, set and selected through input unit 8, acquiring conditions for MR signals, generating conditions and display conditions for image data, reference imaging conditions, imaging mode, preceding performance, and also stores optimized imaging condition data supplied from stimulus index computing unit 10.

Based on MR signal acquiring conditions, preceding performance and optimized imaging conditions stored in the memory circuit, the CPU in main control unit 161 sets each of magnitude, polarity, supplying time and supply timings of pulse currents supplied to gradient magnetic field coils 21 and RF coil unit 30. The CPU in main control unit 161 further acquires MR signals by supplying these set data to sequence control unit 162.

In particular, when the resolution preceding mode is selected through the preceding performance selecting function unit 82 in input unit 8, an MR imaging operation is performed under optimized imaging conditions that are obtained by renewing the reference imaging conditions so that the best spatial resolution of image data is acquired.

Meanwhile, when the TE/TR preceding mode is selected in the preceding mode selection function unit 82 of input unit 8, an MR imaging operation is performed under optimized imaging conditions by shortening the TE/TR so that contrast resolution and time resolution, i.e., real-time appearance of image data, become best.

Sequence control unit 162 also includes a CPU and a memory circuit in order to store the set data supplied from main control unit 161. The CPU of sequence control unit 162 generates sequence control signals based on the stored set data in order to control gradient magnetic field power sources 22 in gradient magnetic field generating unit 2 and transmission/reception unit 3. Top plate moving control unit 163 generates top plate moving control signals based on top plate moving instruction signals supplied from input unit 8 through main control unit 161 in order to supply top plate moving control signals to top plate moving mechanism unit 5.

FIGS. 7A-7E illustrate pulse sequences for the steady-state free-precession (SSFP) method. The SSFP method is one high-speed imaging method. By using the SSFP method as an example, the time rate of change of magnetic field intensity is explained in more detail. According to this method, high-speed imaging can be performed since a steady-state can be established with an extremely short repetition time (TR).

Figure 7:
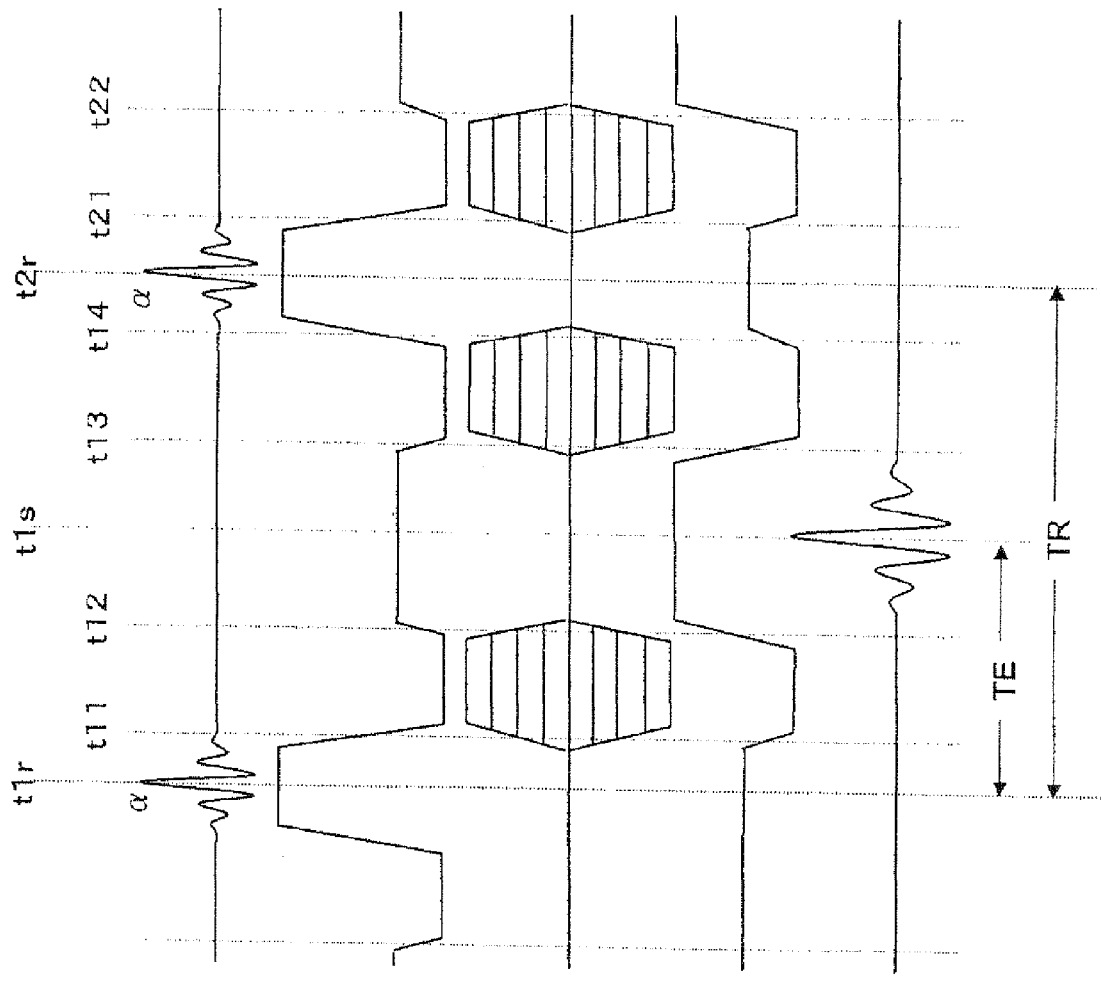
FIG. 7A illustrates RF pulses irradiated onto an object from an RF coil unit in the exemplary embodiment of MRI apparatus.
FIG. 7B illustrates slice-selection gradient magnetic fields supplied to the object through a gradient magnetic field coil in the exemplary embodiment of MRI apparatus.
FIG. 7C illustrates gradient magnetic fields of a gradient magnetic field coil in the exemplary embodiment of MRI apparatus.
FIG. 7D illustrates frequency-encoding gradient magnetic fields of a gradient magnetic field coil in the exemplary embodiment of MRI apparatus.
FIG. 7E illustrates an MR signal from the imaged object detected through a receiving coil in the exemplary embodiment of MRI apparatus.

FIG. 7A illustrates RF nuclei nutation pulses irradiated onto object 150 from RF coil unit 30. FIG. 7B illustrates slice-selection gradient magnetic field Gs applied onto object 150 from gradient magnetic field coils 21. FIG. 7C illustrates phase-encoding gradient magnetic field Ge. FIG. 7D illustrates frequency-encoding gradient magnetic field Gr. FIG. 7E illustrates MR responsive RF signals from object 150 detected through receiving coil 33.

Each of the RF pulses shown at each of the times $t1r$, $t2r$, - - -, in FIG. 7A supplies necessary energy to nutate nuclear spins in tissues of the object in order to rotate the nuclear spins by a flip angle $\alpha$ degrees. Echo time (TE) indicates a time between an irradiation of the flip angle $\alpha$ degrees RF pulse and a detection of the responsive MR signals. Repetition time (TR) indicates a time between a first RF pulse $t1r$ and a second RF pulse $t2r$. Each polarity of slice-selection gradient magnetic field Gs, phase-encoding gradient magnetic field Ge, and frequency-encoding gradient magnetic field Gr shown in FIGS. 7B to 7D is based on the SSFP pulse sequence under initially set MR signal acquiring conditions.

In this embodiment, for instance, each of slice-selection gradient magnetic field Gs (FIG. 7B), phase-encoding gradient magnetic field Ge (FIG. 7C) and frequency-encoding gradient magnetic field Gr (FIG. 7D) is switched at each of times $t11$, $t12$, $t13$ and $t14$ following irradiation by an RF pulse of flip angle $\alpha$ degrees at the first time $t1r$. Similarly, each the magnetic fields is switched at each of times $t21$, $t22$, etc. following the RF pulse of flip angle $\alpha$ degrees at a second time $t2r$.

As illustrated in FIGS. 7B to 7D, when each of slice-selection gradient magnetic field Gs, phase-encoding gradient magnetic field Ge and frequency-encoding gradient magnetic field Gr is simultaneously switched, the time rates of change of magnetic field intensity of the respective gradient magnetic fields are summed up. Based on the summed time rates of change of the magnetic field intensities, eddy currents in object 150 are generated. The exemplary embodiment efficiently searches and selects an appropriate set of imaging conditions that meets international criteria on safety against eddy currents in an MRI apparatus.

Figure 8:
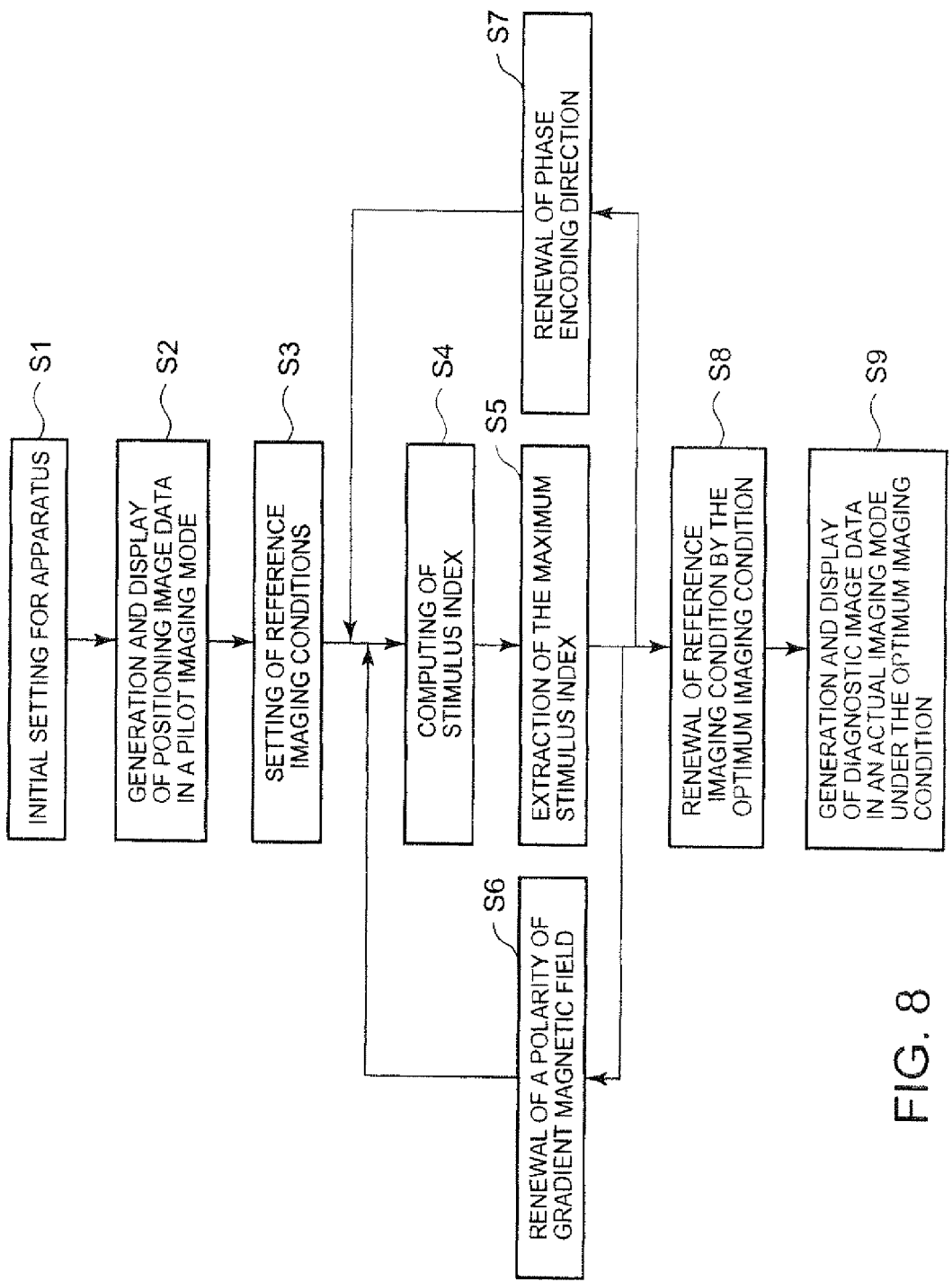
FIG. 8 is a flowchart illustrating a renewal procedure of imaging conditions in the exemplary embodiment of MRI apparatus.

FIG. 8 is a flowchart illustrating a renewal procedure of the imaging conditions in one exemplary embodiment. An operator of MRI apparatus 200 inputs a top plate moving instruction signal from input unit 8 prior to performing pilot imaging of object 150 in order to move top plate 4 along the body axis direction (z-axis direction) so that a diagnosis portion in object 150 is located at an imaging volume in a center portion of a gantry. Further, through input unit 8, the initial settings for the apparatus, such as an input of object data, a setting of the MR signals acquiring conditions including MRI pulse sequences (e.g., of the SSFP method), and settings of image data generating conditions and image data display conditions, are performed. These input data and the set data are stored in memory circuits provided in main control unit 161 (FIG. 8, step S1).

When the initial settings are completed, the operator selects a pilot imaging mode for acquiring positioning image data. After selecting the pilot imaging mode, the operator inputs an imaging start command through input unit 8. By supplying the command signals to main control unit 161 in control unit 16, the pilot imaging applied with the selected MRI (e.g., SSFP) method is started. The acquired positioning image data at this time is displayed on a monitor in display unit 7 (FIG. 8, step S2).

By observing positioning image data on display unit 7, the operator sets desired initial reference imaging conditions for a subsequent actual diagnostic imaging mode by moving a cross-section setting marker displayed superposed on positioning image data to a desired position and direction by using input devices provided by input unit 8. The reference imaging conditions include position and direction of the slice-section, and a phase-encoding direction. These set data are also stored in the memory circuit in main control unit 161 (FIG. 8, step S3).

When each of slice-selection gradient magnetic field Gs, phase-encoding gradient magnetic field Ge and frequency-encoding gradient magnetic field G that are to be used for acquiring diagnostic MR data is switched at the MRI-sequence prescribed speed, the calculation unit in stimulus index computing unit 10 calculates the rate of change of the magnetic field intensities for each switched gradient field based on the MR signal acquiring conditions including the MRI pulse sequence (e.g., the SSFP method) initially set at input unit 8 and the reference imaging conditions set in step S3 by using a calculation program in the program memory unit. Further, when a plurality of different gradient magnetic fields is simultaneously switched, a composite rate of change of magnetic field intensity is calculated by summing up the rates of change of magnetic field intensity for each of the plurality of simultaneously switched gradient magnetic fields.

Next, the calculation unit in stimulus index computing unit 10 calculates a stimulus index for a variation of gradient magnetic field by inputting the calculated rate of change of magnetic field intensity (or the composite rate of change of magnetic field intensity) and the switching time of the gradient magnetic field used for calculating the rate of change of the magnetic field intensity into the calculation program stored in the program memory unit (FIG. 8, step S4).

Meanwhile, the comparison unit in stimulus index computing unit 10 extracts the maximum stimulus index by comparing a plurality of stimulus indices calculated at a plurality of gradient magnetic field switching times in the MRI pulse sequence (e.g., SSFP) method (FIG. 8, step S5).

In order to search for an optimum imaging condition so that the maximum stimulus index is minimized, imaging condition renewal unit 9 successively renews (i.e., changes) the polarity of the initially set slice-selection gradient magnetic field Gs and phase-encoding gradient magnetic field Ge through reference imaging condition setting function unit 81 in input unit 8. The calculation unit and the comparison unit in stimulus index computing unit 10 respectively repeat calculations of the stimulus indices and extraction of the maximum stimulus indices against the renewed polarity gradient magnetic fields (FIG. 8, steps S4-S6).

Imaging condition renewal unit 9 further successively renews the phase-encoding direction initially set by reference imaging condition setting function unit 81 in input unit 8. Each of the calculation unit and the comparison unit in stimulus index computing unit 10 respectively repeats calculations of the stimulus indices for each of the renewed phase-encoding directions and extractions of the maximum stimulus indices (FIG. 8, steps S4-S7).

By successively renewing polarity and phase-encoding direction for the gradient magnetic fields, a minimum value of the maximum stimulus index is searched for from among a plurality of acquired maximum stimulus indices. The polarity and phase-encoding direction of the gradient magnetic fields used for acquiring the searched minimum value of the maximum stimulus index is set as an optimum imaging condition. By thereafter using the acquired optimum imaging condition, the reference imaging conditions stored in the memory circuit in main control unit 161 are renewed (FIG. 8, step S8).

Next, main control unit 161 that receives a command signal supplied from input unit 8 for instructing a start of the actual diagnostic imaging mode reads out the preliminarily set MR signal generating conditions and the renewed optimum imaging conditions from the memory circuit. Based on these data, image data in the actual diagnostic imaging mode applying the chosen (e.g., SSFP) method is generated and displayed (FIG. 8, step S9).

According to one exemplary embodiment, it becomes possible to easily and in a short time set imaging conditions that can acquire desired image data while preventing dangerous eddy currents from occurring. Thus, the occurrence of eddy currents generated in the object by time variations of the magnetic fields can be restrained to be an allowable level. Consequently, examination efficiency can be improved and loads on an object and an operator can be reduced.

In particular, since a selection function unit can be used for selecting either the resolution preceding mode or the TE/TR preceding mode, it becomes possible to easily acquire image data that has excellent spatial resolution or contrast resolution under optimized imaging conditions so that the maximum stimulus index takes its lowest value.

Further, when the parallel imaging (PI) method is applied in an actual diagnostic imaging mode, the phase-encoding direction for the optimum imaging condition can be set within the scope of phase-encoding directions that can acquire image data having a desired equal magnification. Consequently, an efficient PI imaging can be performed while reducing adverse influences due to variations of magnetic field intensities.

While the exemplary embodiment can set optimum imaging conditions in the high-speed PI imaging, it is not limited to such method. Further, while the present exemplary embodiment can set the optimum imaging conditions in the high-speed SSFP imaging method, other high-speed imaging methods, such as the fast FE method or the echo planar imaging (EPI) method, or usual imaging methods, such as the SE method or the FE method, can also be used.

In the pilot imaging mode of the above-explained exemplary embodiment, positioning image data can be generated using the same SSFP method in the actual diagnostic imaging mode. It is, of course, possible to apply different imaging modes in the pilot imaging mode and in the actual diagnostic imaging mode.

In the exemplary embodiment, in order to renew the optimum imaging condition, firstly, the optimum polarity combination that produces the lowest maximum rate of change of the magnetic field intensities is searched for by successively renewing polarities of slice-selection gradient magnetic field Gs, phase-encoding gradient magnetic field Ge and frequency-encoding gradient magnetic field Gr. Secondly, the optimum phase-encoding direction that produces the lowest maximum rate of change of magnetic field intensities is searched for by successively renewing phase-encoding directions.

Of course, a search for the optimum phase-encoding direction can be performed based on instruction signals supplied from input unit 8. Since renewal of phase-encoding directions in the MR imaging sequence (e.g., the PI method) can influence the expansion efficiency that determines an equal magnification for high-speed imaging, it may be desired to limit the scope of this. By restraining the scope of renewal in the phase-encoding directions, it becomes possible to shorten the calculation time of the rate of change of the magnetic field intensities.

While the exemplary embodiment sets as the optimum imaging conditions that which produces the lowest value for the maximum stimulus index by renewing the polarity of the gradient magnetic field and the phase-encoding direction, the optimum imaging conditions can also be set by iteratively renewing other imaging parameters. Further, while the frequency-encoding direction is renewed in accordance with renewal of the phase-encoding direction, it is possible to renew the frequency-encoding direction independently from renewal of phase-encoding direction.

In the above-mentioned exemplary embodiment, the stimulus index is computed by substituting a rate of change of magnetic field intensities and a gradient magnetic field switching time at a prescribed formula. It is also possible to read out a stimulus index corresponding to the rate of change of magnetic field intensities and the gradient magnetic field at the switching times from among a plurality of stimulus indices preliminarily stored as parameters.

Other consistent embodiments will be apparent to those skilled in the art from consideration of the specification and practices disclosed herein. It is intended that the specification and examples be considered as exemplary only.

What is claimed is:

1. A magnetic resonance imaging (MRI) apparatus configured to generate image data based on magnetic resonance (MR) signals generated from an object positioned in a static magnetic field and a plurality of gradient magnetic fields by irradiating radio frequency (RF) pulses, the MRI apparatus comprising:
   (1) an imaging condition renewal unit configured to iteratively renew each of plural preliminarily set reference MR imaging conditions for the plurality of gradient magnetic fields;
   (2) an eddy current stimulus index computing unit configured to compute an eddy current stimulus index corresponding to expected eddy current generation for each of the plurality of gradient magnetic fields at each of the renewed reference MR imaging conditions and to determine an appropriate set of MR imaging conditions for the plurality of gradient magnetic fields based on the computed stimulus indices; and
   (3) a control unit configured to control MR imaging operations on the object based on the determined appropriate MR imaging conditions.

2. The MRI apparatus according to claim 1, wherein the imaging conditions renewal unit renews a polarity of at least one of (a) a slice-selection gradient magnetic field and (b) a phase-encoding gradient magnetic field of the reference MR imaging conditions for the plurality of gradient magnetic fields.

3. The MRI apparatus according to claim 1, wherein the imaging conditions renewal unit renews at least a phase-encoding direction for a prescribed slice-section in the reference MR imaging conditions for the plurality of gradient magnetic fields.

4. The MRI apparatus according to claim 3, wherein the imaging conditions renewal unit renews phase-encoding direction within an effective angle range for a parallel imaging (PI) operation.

5. The MRI apparatus according to claim 1, wherein the stimulus index calculation unit calculates stimulus indices based on the rate of change of magnetic field intensities for each of the slice-selection gradient magnetic field, the phase-encoding gradient magnetic field and the frequency-encoding gradient magnetic field, or based on a composite rate of change of magnetic field intensity acquired by combining the rate of change of magnetic field intensities occurring at a same switching time of the gradient magnetic field in an MRI pulse sequence.

6. The MRI apparatus according to claim 1, wherein the stimulus index calculation unit searches for a set of reference imaging conditions where the maximum stimulus index takes its lowest value at a pulse sequence field switching time calculated for each of plural sets of renewed reference imaging conditions.

7. The MRI apparatus according to claim 1, further comprising:
   a reference imaging conditions setting unit;
   wherein the reference imaging conditions setting unit sets reference imaging conditions of the gradient magnetic fields for acquiring diagnostic image data in an actual diagnostic imaging mode by using object positioning image data acquired in a pilot imaging mode.

8. The MRI apparatus according to claim 1, wherein the control unit effects MR imaging with a preceding spatial resolution based on spatial resolution of the searched imaging conditions for the gradient magnetic fields.

9. The MRI apparatus according to claim 1, wherein the control unit presets time parameters, including at least one of an echo time (TE) and a repetition time (TR) based on the searched imaging conditions for the gradient magnetic fields.

10. The MRI apparatus according to claim 9, wherein the control unit effects magnetic resonance imaging with a preceding contrast resolution or time resolution by shortening time parameters, including at least one of echo time (TE) and repetition time (TR).

11. The MRI apparatus according to claim 1, wherein the stimulus index calculate unit searches for a set of imaging conditions where the rate of change of magnetic field intensity (dB/dt) takes its lowest value.

12. The MRI apparatus according to claim 9, wherein the control unit controls thickness of a slice cross-section or a spatial resolution for reference imaging conditions for the gradient magnetic fields corresponding to the lowest value in a prescribed range of the rate of change of magnetic field intensity (dB/dt) searched by the stimulus index calculation unit.

13. The MRI apparatus according to claim 9, wherein the control unit controls the rate of change of magnetic field intensity (dB/dt) searched by the stimulus index calculation unit so that time resolution takes a maximum value.

14. The MRI apparatus according to claim 9, further comprising:
   a display unit including a monitor for displaying reference imaging conditions for the plurality of gradient magnetic fields searched by the stimulus index calculation unit so as to permit operator selection of an appropriate set of reference imaging conditions for gradient magnetic fields.

15. The MRI apparatus according to claim 14, wherein the display unit displays a plurality of phase-encoding direction data for different angles or a plurality of rectangular regions of interest (ROI) in order to permit operator selection of a desired phase-encoding direction data or a desired ROI.

16. The MRI apparatus according to claim 1, wherein the image data is acquired by imaging at an oblique cross-section in an operator-selected optional direction.

17. A magnetic resonance (MR) imaging method configured to generate MR image data based on MR signals generated from an object positioned in a static magnetic field and a plurality of switched gradient magnetic fields by irradiating radio frequency (RF) pulses, the MR imaging method comprising:
   (1) renewing preliminarily set reference MR imaging conditions for the plurality of switched gradient magnetic fields;
   (2) computing an eddy current stimulus index for each of the plurality of switched gradient magnetic fields using each set of the renewed reference MR imaging conditions and determining an appropriate set of MR imaging conditions for the gradient magnetic fields based on the computed eddy current stimulus indices; and
   (3) controlling an MR imaging operation on the object based on the determined appropriate set of MR imaging conditions.

18. A magnetic resonance imaging (MRI) method configured to use an optimized set of reference imaging conditions which reduces undesired eddy current generation in an object being imaged, said method comprising:
   (1) using at least one non-transitory programmed computer configured (a) to calculate a maximum eddy current stimulus index for a designated MRI method and an initially designated set of reference imaging conditions; (b) to iteratively repeat the calculation of a maximum eddy current stimulus index for said designated MRI method and different designated sets of reference imaging conditions; and (c) to designate as an optimum set of reference imaging conditions the set for which the calculated maximum eddy current stimulus index had the smallest value; and
   (2) using an MRI apparatus (a) to perform a diagnostic MRI data acquisition scan using said designated MRI method and said optimum set of reference imaging conditions; and (b) to process such acquired MRI data into image data which is stored or displayed as a diagnostic image.

19. The method according to claim 18, wherein the iteratively changed reference imaging conditions include at least one of (a) polarity of a slice-selecting gradient field, (b) polarity of a phase-encoding gradient field, (c) direction of a phase-encoding gradient field, (d) an echo time (TE), and (e) a repetition time (TR).

20. The method according to claim 18, wherein said initially designated set of reference imaging conditions is designated by an operator using displayed MRI data acquired in a preliminary pilot imaging mode.

* * * * *